(12) United States Patent
Voisine et al.

(10) Patent No.: US 6,677,742 B1
(45) Date of Patent: Jan. 13, 2004

(54) UTILITY METER HAVING A SECURITY SEALING ARRANGEMENT

(75) Inventors: John T. Voisine, Lafayette, IN (US); Ronald C. Tate, Battleground, IN (US)

(73) Assignee: Landis+Gyr Inc., Lafayette, IN (US)

( * ) Notice: Subject to any disclaimer, the term of this patent is extended or adjusted under 35 U.S.C. 154(b) by 404 days.

(21) Appl. No.: 09/667,888

(22) Filed: Sep. 22, 2000

Related U.S. Application Data (60) Provisional application No. 60/155,980, filed on Sep. 24, 1999, provisional application No. 60/156,301, filed on Sep. 24, 1999, and provisional application No. 60/155,852, filed on Sep. 24, 1999.

(51) Int. Cl.[7] .............................. G01R 1/00; G01R 1/04; H02B 1/00
(52) U.S. Cl. ...................... 324/110; 324/156; 361/666; 361/667
(58) Field of Search ................................ 324/156, 110; 340/693.9; 361/659, 666, 667; 292/290, 297, 307 R; 70/77, 158

(56) References Cited

U.S. PATENT DOCUMENTS

| | | | |
|---|---|---|---|
| 3,683,102 A | 8/1972 | Moran et al. ................. 174/50 |
| 3,943,441 A | 3/1976 | Shackford ................... 324/110 |
| 4,076,291 A | 2/1978 | Pope et al. ................. 292/256 |
| 4,146,258 A | 3/1979 | Andruchiw ................. 292/256 |
| 4,149,741 A | 4/1979 | Lipscomb et al. .......... 292/256 |
| 4,212,262 A | 7/1980 | Gorrell ....................... 116/307 |
| 4,262,946 A | 4/1981 | Swisher ...................... 292/307 |
| 4,326,395 A | 4/1982 | DeRosa ........................ 70/168 |
| 4,422,325 A | 12/1983 | Sutherland et al. ........... 73/273 |
| 4,422,679 A | 12/1983 | Ruscitto ................. 292/307 R |
| 4,477,861 A | 10/1984 | Byrd, Jr. et al. ............. 361/371 |
| 4,747,016 A | 5/1988 | Sloop, Sr. ................... 361/364 |
| 4,883,295 A | 11/1989 | Kesselman ................. 292/307 |
| 5,048,881 A | 9/1991 | Renfro ........................ 292/320 |
| 5,161,838 A | 11/1992 | Ely et al. .................... 292/327 |
| 5,181,166 A | 1/1993 | Howell ....................... 361/364 |
| 5,207,595 A | 5/1993 | Learmont et al. ........... 439/517 |
| 5,423,695 A | 6/1995 | Robinson et al. ........... 439/517 |
| 5,476,731 A | 12/1995 | Karsten et al. ............... 429/97 |
| 5,503,271 A | 4/1996 | Lynch ......................... 206/305 |
| 5,514,959 A | 5/1996 | Horan et al. ................. 324/110 |
| 5,546,269 A | 8/1996 | Robinson et al. ........... 361/660 |
| 5,741,969 A | 4/1998 | Sebastopoli .................. 73/273 |
| 5,767,790 A | 6/1998 | Jovellana .................... 340/870 |
| 5,825,303 A | 10/1998 | Bloss, Jr. et al. ........... 340/870 |
| 5,861,742 A | 1/1999 | Miller et al. ................ 324/156 |
| 5,898,387 A | 4/1999 | Davis et al. ................ 340/870 |
| 5,933,004 A | 8/1999 | Jackson et al. ............. 324/142 |
| 5,959,243 A | 9/1999 | Thiel .......................... 174/17 |

FOREIGN PATENT DOCUMENTS

| | | |
|---|---|---|
| CH | 683660 A5 | 4/1994 |
| FR | 0 168 279 | 5/1985 |
| GB | 2276728 A | 10/1994 |
| GB | 2296090 A | 6/1996 |
| JP | 10333575 | 12/1998 |
| WO | WO 01/22098 A1 | 3/2001 |

*Primary Examiner*—N. Le
*Assistant Examiner*—Donald M Lair
(74) *Attorney, Agent, or Firm*—Maginot, Moore & Beck (57) ABSTRACT

An arrangement for use in a utility meter having a base configured to be mounted to a structure and a component module adapted to be releasably secured to the base inhibits unauthorized removal of the component module from the base. The arrangement includes a mounting fastener assembly disposed on the component module and a closure element. The mounting fastener assembly has an access opening configured to receive a mounting fastener and a mounting opening configured to allow a portion of the mounting fastener to extend therethrough and into the base. The mounting fastener includes a portion configured to be retained by the base. The closure element is pivotally attached to the component module and is movable into a first position wherein the closure element restricts the access opening and into a second position wherein the access opening is accessible.

24 Claims, 10 Drawing Sheets

UTILITY METER HAVING A SECURITY SEALING ARRANGEMENT

This application claims the benefit of U.S. Provisional Patent Application No. 60/155,980, U.S. Provisional Patent Application No. 60/156,301 and U.S. Provisional Patent Application No. 60/155,852, all filed Sep. 24, 1999.

FIELD OF THE INVENTION

The present invention relates to utility meters and, more particularly, to a modular utility meter having at least one removable module.

DESCRIPTION OF THE PRIOR ART

Utility meters are commonplace with regard to measuring utility or commodity consumption or usage (e.g. electricity, gas, water, and the like) for billing the consumer. Such utility meters are interposed between the source of the utility and the usage point. The utility meters are generally located proximate the area of usage of the commodity and, in the case of electricity meters, may be mounted on a side of the facility in which the electrical energy is consumed.

There are many types and varieties of utility meters including those that measure kilowatt-hours only, and those that have expanded capability to perform demand metering or time of use metering. Utility meters may also measure and/or calculate various other energy-related quantities that may be useful for load optimization or diagnostic purposes.

Utility meters that measure electricity usage typically include sensor circuitry and measurement or registration circuitry. The sensor circuitry obtains energy-related measurements from the utility power lines. The measurement or registration circuitry generates energy consumption information that can be communicated externally via a display and/or external communications.

While the sensor circuitry is typically analog, the measurement or registration circuitry often incorporates digital circuitry as well as analog components. More recently, digital circuitry has been increasingly employed because of its ability to generate and analyze energy consumption data in a variety of ways. Electricity meters having digital processing circuitry are in widespread use.

One advance that has arisen with the use of digital circuitry in electricity meters is the ability to employ modular meter designs. In particular, because the metering information is generated by digital circuits as opposed to mechanical counters and registers, the metering information is readily communicated via electrical signals between modular components. One example of a modular meter is that described in U.S. Pat. No. 5,933,004. The meter described in U.S. Pat. No. 5,933,004 includes a sensor module which includes the meter's sensor circuitry and a removable measurement module that contains the registration circuitry and meter displays. The modular meter allows for easy upgrade or enhancement to the meter because the measurement module or removable component module may easily be replaced by an upgraded or enhanced component module. By contrast, upgrade of a non-modular meter often required replacement of the entire meter, which incurred unnecessary expense.

One problem that has arisen from the use of modular meters is the increased need to inhibit or prevent tampering and/or disassembly of the meter for any purpose by unauthorized persons. Methods preventing tampering in non-modular meters have been in use for years. Such methods may include the installation of the meter into a meter mounting device that is locked or sealed.

The prior methods of preventing tampering, however, do not address the unique characteristics of modular meters. In particular, the prior methods of preventing removal of the entire meter are typically installed at or near the base of the meter, which is the location of the non-removable module of a modular meter. As a result, such methods do not adequately prevent the separation of the removable module from the non-removable module of the meter. The separation of the removable module from the non-removable module by unauthorized persons can result in energy theft, damage to the meter, and even injury.

For example, in many modular meters, including the one discussed above, it is the removable module that contains the circuitry that retains the energy consumption information for billing purposes. As a result, separation of the removable module from the base module of the meter can result in potential energy theft. Even if separation of the removable module could not result in energy theft, the removal of the module by an unauthorized person may nevertheless damage the meter and/or expose the person to injury.

Thus, prior art meter sealing devices do not adequately inhibit the separation of a removable component module from the base module of a meter. It is noted that other types of prior art seals exist that are provided primarily for warranty purposes and not for tamper protection because the seal is not readily accessible. As such, the prior art seals do not provide an adequate deterrent against tampering.

There is a need, therefore, for an arrangement that inhibits separation of modules of a modular meter. To the extent that such arrangement cannot prevent separation, it is desirable that such an arrangement provide some visible indication of tampering should separation of the modules occur.

SUMMARY OF THE INVENTION

The present invention is a utility meter having a component module or housing removably mountable to a base wherein the component module includes a security sealing device for a module-to-base mounting fastener. The security sealing device provides a visible, tamper resistant feature for the utility meter.

In one form, the present invention is an arrangement for use in a utility meter having a base configured to be mounted to a structure and a component module adapted to be releasably secured to the base. The arrangement inhibits unauthorized removal of the component module from the base. The arrangement includes a mounting fastener assembly disposed on the component module and a closure element. The mounting fastener assembly has an access opening configured to receive a mounting fastener and a mounting opening configured to allow a portion of the mounting fastener to extend therethrough and into the base. The mounting fastener includes a portion configured to be retained by the base. The closure element is pivotally attached to the component module and is movable into a first position wherein the closure element restricts the access opening and into a second position wherein the access opening is accessible.

In another form, the present invention is a component module for a modular utility meter, the component module configured to be releasably coupled with a base that is adapted to be mounted to a structure and in communication with a utility commodity. The component module includes a housing, a fastener mount, and a closure element. The fastener mount is disposed on the housing and includes a first opening configured to receive a mounting fastener and a second opening configured to allow a portion of the mounting fastener to extend therethrough to be received by the base. The mounting fastener includes a portion configured to be retained by the base. The closure element is operable in a first position to restrict access to the first opening, and is operable in a second position to allow access to the first opening.

In yet another form, the present invention is an arrangement for use in a utility meter having a housing configured to be releasably secured to a structure. The arrangement inhibits unauthorized removal of the housing from the structure and includes a mounting fastener assembly and a closure element. The mounting fastener assembly is disposed on the housing. The mounting fastener assembly has an access opening configured to receive a mounting fastener, the mounting fastener configured to fasten the housing to the structure. The closure element is pivotally attached to the component module, the closure element movable into a first position wherein the closure element restricts the access opening and into a second position wherein the access opening is accessible.

It is noted that the present invention provides an arrangement for inhibiting unauthorized removal of a meter housing from a structure that may be used to inhibit unauthorized removal of a component module from a base module of a modular meter. However, it is noted that such arrangement is furthermore useful for inhibiting the removal of any meter housing from any structure to which it is secured. Thus, at least some aspects of the present invention have application in non-modular meters as well.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein are not to be construed as limiting the scope of the invention in any manner.

DETAILED DESCRIPTION

Figure 1:
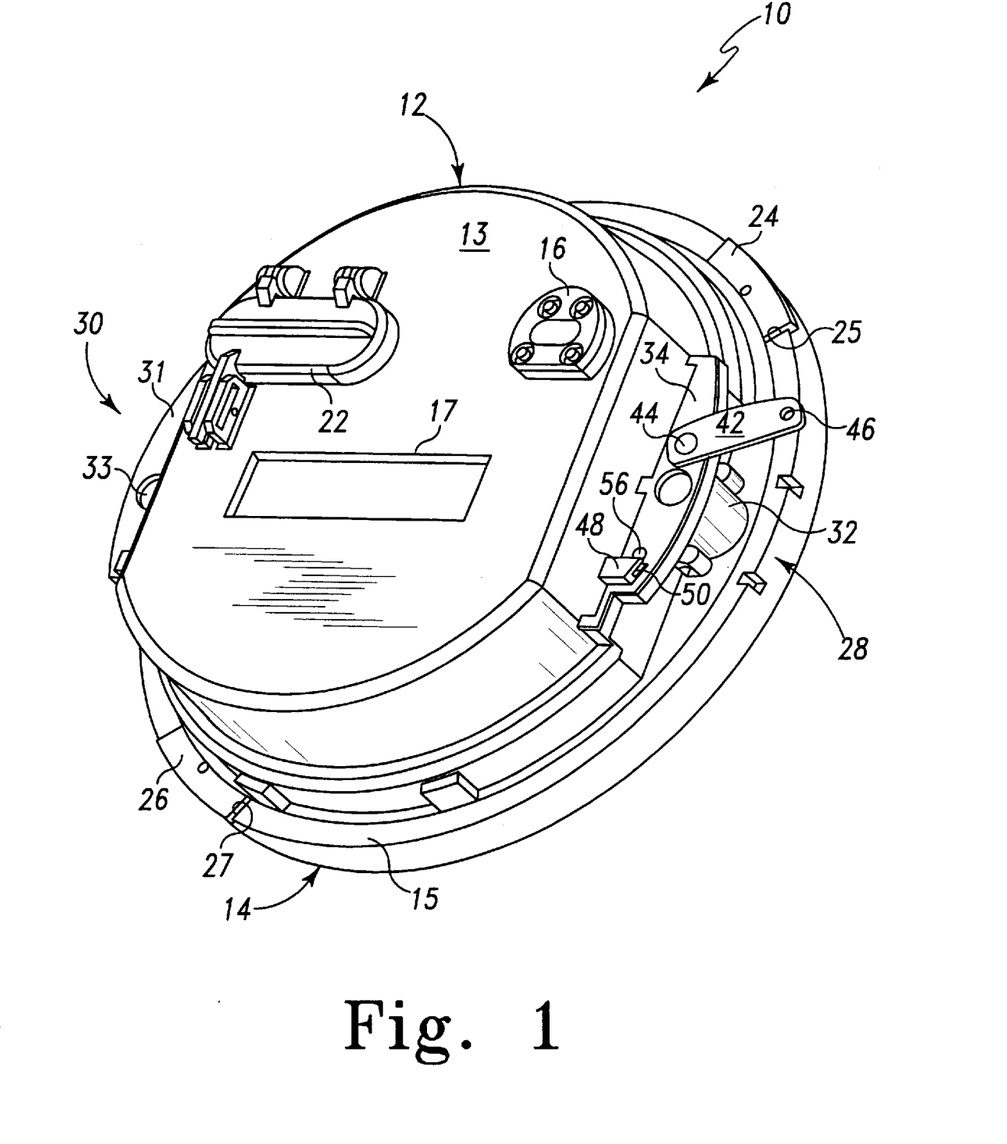
FIG. 1 is a perspective view of a first embodiment of a utility meter embodying the arrangement of the present invention.
Figure 4:
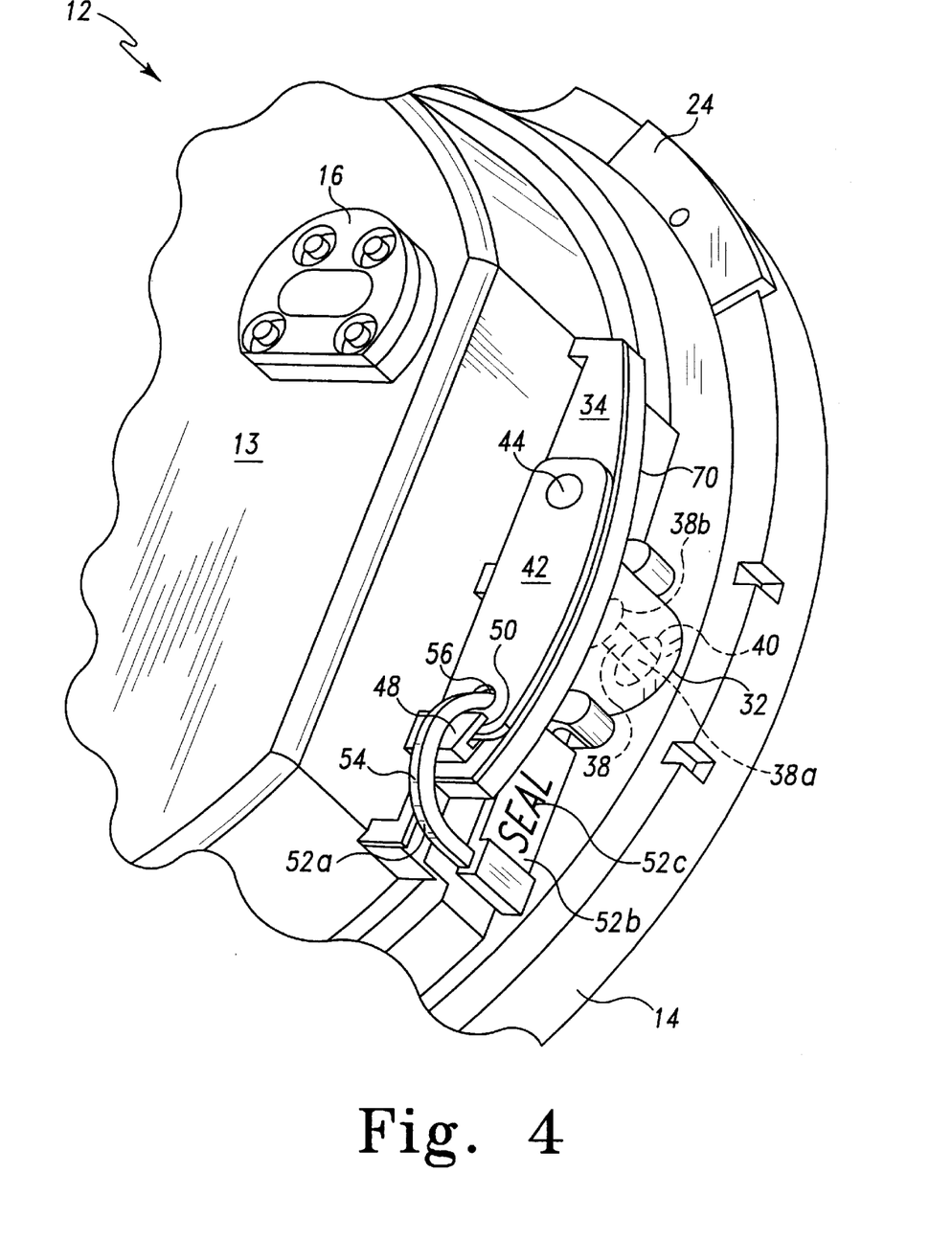
FIG. 4 is an enlarged fragmentary perspective view of the utility meter of FIG. 1 showing the closure member in a closed position.

With reference now to FIGS. 1 and 4, there is depicted a utility meter generally designated 10. While the present invention is depicted and described with reference to and in conjunction with an electricity or watt-hour meter, and particularly a solid state electricity/watt-hour meter, it should be appreciated that the present invention is not limited to solid state electricity/watt-hour utility meters, but is applicable to all types of similarly configured utility meters. Hereafter the term "meter" will be used to refer to the utility meter 10 shown in the figures and all types of similarly configured utility meters.

While not shown in the figures, it should be appreciated that the meter 10 includes all necessary components, connection circuitry, and processing circuitry as are known in the art to measure the commodity to which the meter is coupled (e.g. electricity) and to calculate or determine various quantities associated therewith. In the case of an electricity meter, the meter typically measures voltage and current per phase and calculates or determines such quantities as peak demand and total kilowatt hours used. Exemplary components, connection and processing circuitry for a solid state electricity meter are shown in U.S. Pat. No. 5,933,004 issued to Jackson et al. on Aug. 3, 1999 entitled "Low Profile Modular Revenue Meter" which is specifically incorporated herein by reference.

The meter 10 includes a modular housing, housing unit, or component module 12 that is removably received or mounted onto a base or base unit 14 as described more fully below. The component module 12 encloses or includes the various components and circuitry as that of the measurement module described in U.S. Pat. No. 5,933,004 referenced above, via a shell or cover 13. The base 14 and cover 13 are preferably formed or molded from a suitable plastic such as is known in the art.

The base 14 is adapted to be mounted or affixed to a standard meter mounting device or other structure (not shown) by conventional means well known in the metering art. The base 14 is also adapted to be coupled to a source (not shown) of the commodity (i.e. electricity) which the meter 10 is to measure, also by any conventional means well known in the art. In particular, the base 14 is interposed between the source of the commodity and the load or loads (not shown) utilizing the commodity by suitable contact blades, or via screw terminals. The base 14 is preferably securely attached to the meter mounting device and may have one or more known tamper prevention devices that inhibits the removal of the base 14 from the meter mounting device. This provides a level of security and safety regarding the prevention of someone coming in contact with the commodity. The base 14 may suitably include the circuitry of the sensor module of the meter described in U.S. Pat. No. 5,933,004. However, any suitable sensor circuitry known in the art may be employed.

In the exemplary embodiment described herein, the component module 12 is in electrical communication with the electricity source and load(s) when installed onto the base 14. Particularly, the processing circuitry of the meter 10 within the component module 12 cooperates with the base 14 to measure and calculate various quantities relative to the electricity and the use thereof.

Figure 2:
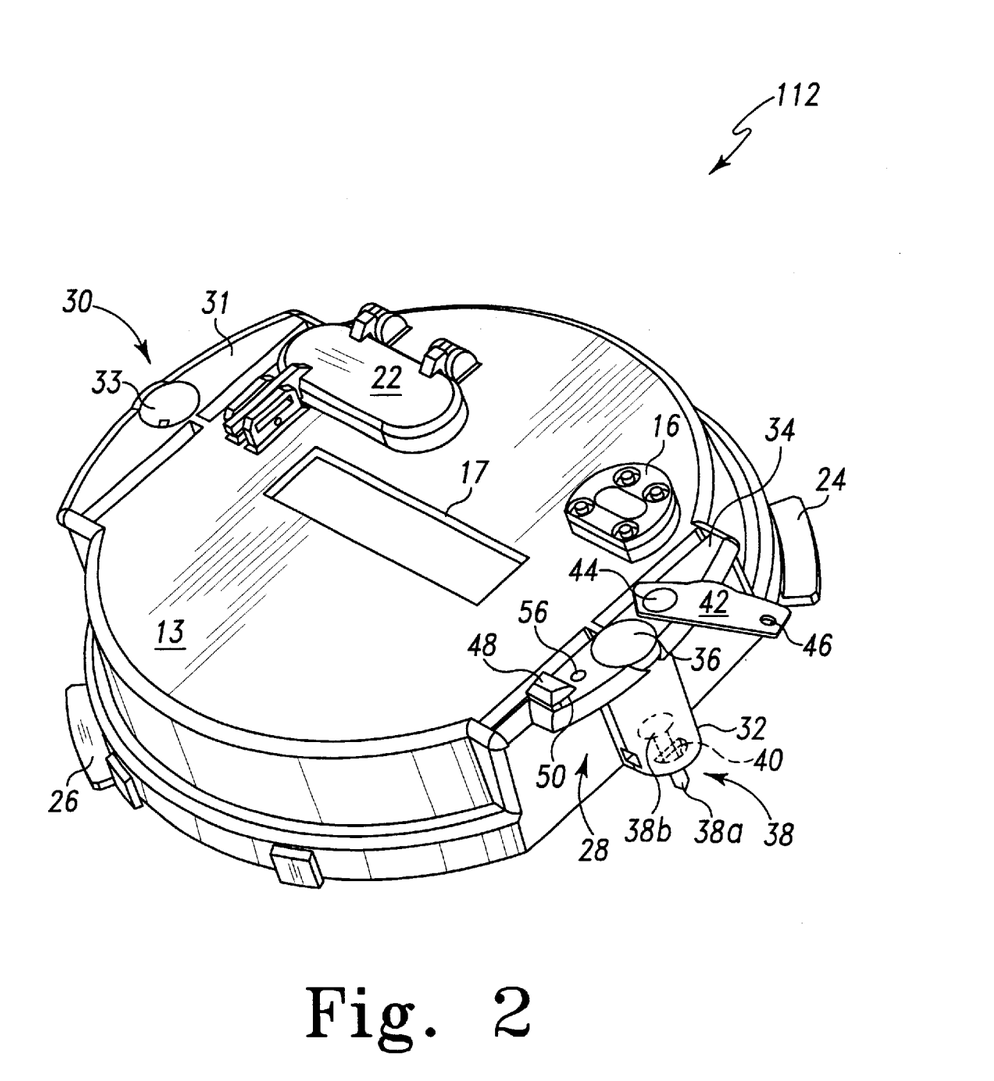
FIG. 2 is a perspective view of a component module or housing of a utility meter embodying the present invention.
Figure 3:
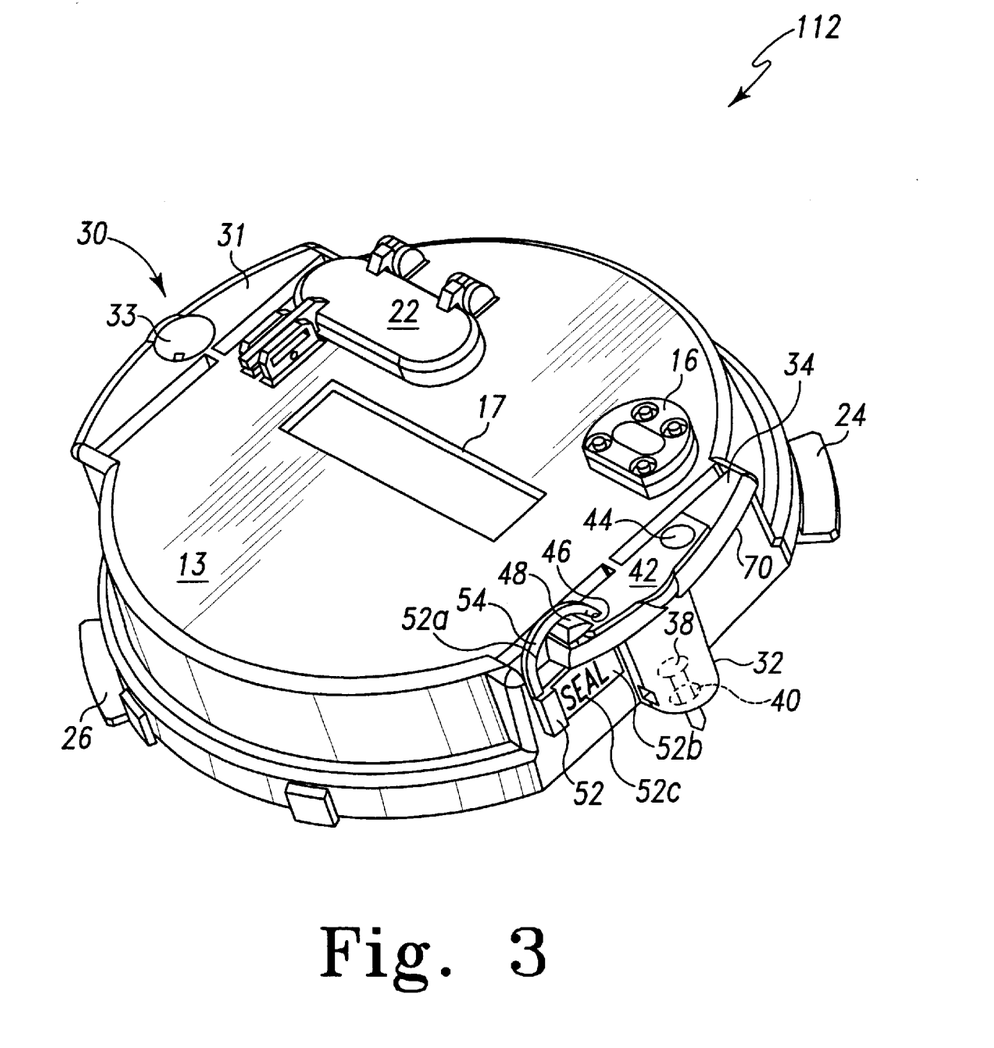
FIG. 3 is a perspective view of the component module or housing of FIG. 2 with the closure member in a closed position.

It is noted that FIGS. 2 and 3 show an alternative component module 112 that represents a slightly modified version of the component module 12. However, the operative elements of the component module 112 are substantially identical to their corresponding elements of the component module 12 and thus are designated by the same reference characters. The component module 112 may be readily interchanged with the component module 12 onto the base 14 of FIGS. 1 and 4.

In any event, the component module 12 of the meter 10 includes an optical reader port 16 known to those skilled in the art that is in electrical communication with the processing circuitry for optically obtaining meter data from the meter 10 and/or transmitting data to the meter 10. A display 17 for displaying various meter data such as total watt-hours used and the like that is likewise in electrical communication with the processing circuitry is typically visible through the clear plastic cover 13. A pivoting hatch 22, shown in a closed position, covers various meter function switches (not shown) such as a demand reset switch that are in communication with the processing circuitry.

As is typical with the present type of utility meter, the component module 12 is essentially a module that is received onto the base 14 in a removable manner, and which thus allows the processing circuitry to be in removable electrical communication with the source of electricity via various prongs or terminals (not shown) that are received by various sockets (not shown) of the base 14 (see U.S. Pat. No. 5,933,004 referenced above). The various prongs or terminals of the component module 12 are located on an underside thereof and are in communication with the processing circuitry within the component module 12. When the component module 12 is received onto the base 14, the various sockets of the base 14 receive the various prongs or terminals of the component module 12 providing an electrical connection therebetween.

The base 14 receives the component module 12 rather snugly, such that removal of the component module 12 from the base 14 requires some effort. Indeed, the size and shape of the component module 12 as well as other standard meter-sized modules do not facilitate favorable leverage from merely grasping the sides of the component module 12. Accordingly, an advantage of the embodiment described herein is the inclusion of an extraction handle arrangement that facilitates manual removal of the component module 12 from the base 14.

In general, the extraction handle arrangement shown in FIGS. 1, 2, 3 and 4 comprises a first overhang 31 and a second overhang 34 that extend radially from the periphery of the component module 12 to form ledges or handles. As shown in FIGS. 1, 2, 3 and 4, the overhangs 31 and 34 may suitably (but need not) be formed as a flange or ear protruding from the periphery of component module 12. The overhangs 31 and 34 each define a graspable surface 70 or concavity that serves as a handle. The graspable surface 70 preferably faces in the direction opposite the direction of removal. In other words, the graspable surface 70 preferably faces down toward the base 14 to facilitate removal of the component module 12 upward away from base 14.

While the two overhangs 31 and 34 are preferably disposed diametrically opposite each other to facilitate an even, smooth, removal operation, it should be appreciated that the number and location of such overhangs along the periphery of the cover 13 may vary. It should further be appreciated that the use of flanges or ears as overhangs 31 and 34 are one way in which a graspable surface overhang may be formed in or about the component module 12. In any form, an overhang may be formed anywhere in the component module 12 that allows one to positively grasp the component module 12 for removal from the base 14.

Figure 5:
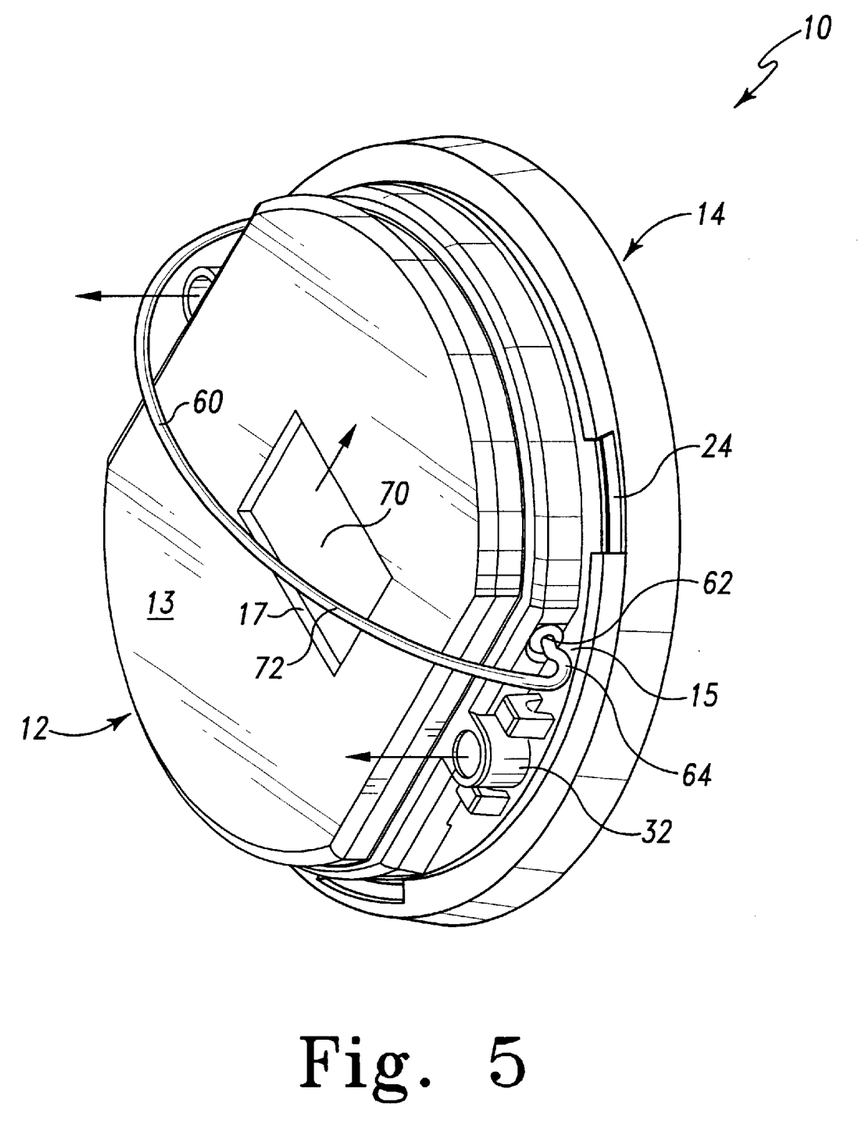
FIG. 5 is a perspective view of a utility meter having an alternative embodiment of a housing extraction device.

Devices other than overhangs 31 and 34 may alternatively be used as extraction handles that facilitate separation of the component module 12 from the base 14. In this regard, reference is made to FIG. 5. In FIG. 5 there is shown the meter 10 with the component module 12 attached to the base 14. The component module. 12 includes an alternate form of an extraction device in the form of a handle 60. The handle 60 includes a curved or bent end 64 that includes a terminus received by a pivot opening 62 in a side or perimeter of the component module 12. While not seen in FIG. 5, the opposite end of the handle 60 terminates in a like curved or bent end that includes a terminus received by a pivot opening in an opposite side or perimeter of the component module 12 to the opening 62.

While the handle 60 is shown in an up or usable position in FIG. 5, the handle 60 is normally in an unused position. In the unused position, the handle 60 is substantially horizontal and preferably rests on or against the periphery 15 (in the plane) of the base 14. Thus, when not in use, the handle 60 pivotally folds against the base 14. In the exemplary embodiment shown in FIG. 5, the handle 60 folds against the base 14 in a direction away from the fastener enclosure 32.

For use in extracting the component module 12, the handle 60 is rotated out 90 degrees from the plane of the base 14 (as depicted in FIG. 5) such that it is vertically disposed. In this position, the central portion 72 facilitates a straight pull to remove the component module 12 from the base 14. Thus, the central portion 72 forms a graspable surface that is disposed opposite the direction of removal, thereby facilitating separation. During rotation or pivoting of the handle 60, the bent or curved ends 64 provide a cam action against the periphery 15 that aids in the initial separation of the component module 12 from the base 14.

The curved ends 64 are configured to engage the periphery 15 at some point during the travel of the handle 60 from the unused position to the usable position shown in FIG. 5. Thus, while the exemplary curved ends 64 shown in FIG. 5 are configured to engage the periphery 15 when the handle 60 has almost completed its travel to the usable position, the curved end 64 may readily be configured to engage the periphery 15 earlier during its travel between the unused and the usable positions.

Figure 5A:
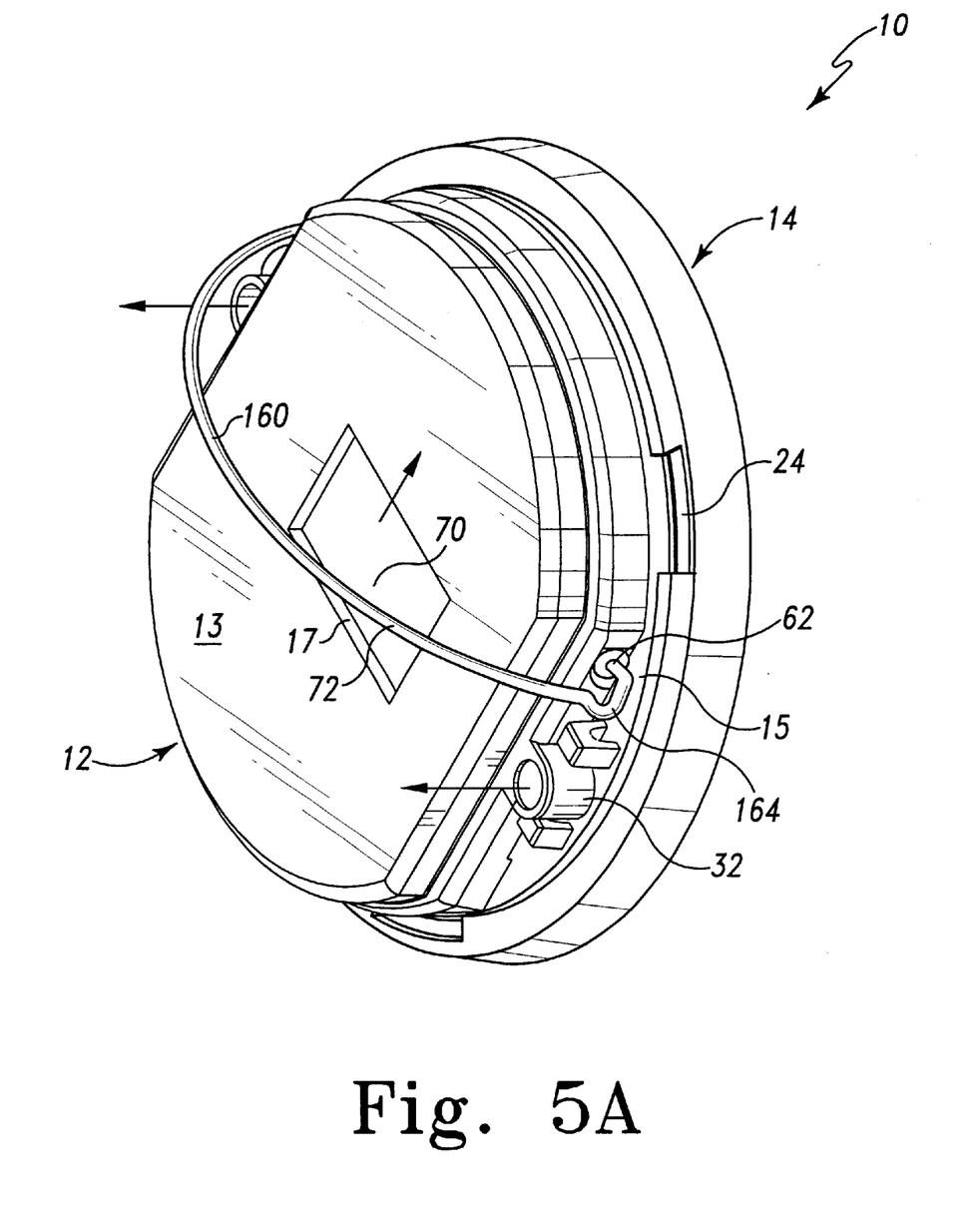
FIG. 5a is a perspective view of a utility meter having another alternative embodiment of the a housing extraction device.

FIG. 5a shows an alternative embodiment of the extraction handle 60 of FIG. 5 specifically designed for the exemplary modular meter 10 which has a relatively low profile. In particular, the extraction handle 160 of FIG. 5a is designed to both aid in the separation of the component module 12 from the base 14, as well as in the separation of the meter 10 as a unit from the meter mounting device, not shown.

By way of background, electricity meters are typically securely coupled to meter mounting devices as is known in the art. Meters include relatively large connector blades that are received by large connector jaws in the meter mounting device, thereby providing a secure attachment. In many cases, separation of the meter from the meter mounting device can be difficult. It is known that utility personnel often use impact forces against the outermost portion of the meter to "rock" the meter out of the metering mounting device. The combination of the moment arm formed by the meter and the impact forces help separate the meter blades from the mounting device jaws. However, the use of impact may undesirably result in damaged components. Moreover, low profile meters such as the meter 10 of FIGS. 1 through 5 do not provide much of a moment arm from which the meter may be "rocked" out of the mounting device.

To address this issue, the handle 160 of FIG. 5a is configured to assist in both the removal of the component module 12 from the base 14 and the removal of the entire meter 10 from the meter mounting device. To this end, the handle 160 may suitably be identical to the handle 60 of FIG. 5 with the exception that the curved end 64 of FIG. 5 is replaced with a curved end 164 specifically configured to engage the periphery 15 only when the handle 60 travels further than the 90 degree usable position.

To this end, the curved end 164 preferably extends from the plane defined by the center portion 72 of the handle 160 in the direction toward the fastener enclosure 32 as shown in FIG. 5a. As a result, the curved end 164 does not engage the periphery 15 of the base 14 during the travel from the unused to the usable position. Instead, the handle 160 must travel beyond the usable position and toward the fastener enclosure 32 before the curved end 164 engages the periphery 15 of the base 14.

As a result, removal of the entire meter 10 from the meter mounting device is facilitated by moving the handle 160 directly from the unused position to the usable position and then pulling the handle. Because the handle 160 is moved directly from the unused position to the usable position, the curved end 164 does not engage the periphery 15 and thus does not aid in separating the component module 12 from the base 14. If the force required to separate the component module 12 from the base 14 exceeds that to separate the entire meter 10 from the meter mounting device, then pulling the handle 160 will separate the meter 10 from the meter mounting device.

By contrast, removal of the component module 12 from the base 14 is facilitated by moving the handle 160 past the usable position, or further in the direction of the fastener enclosure 32, until the curved end 164 engages the periphery 15. At that point the curved end 164 provides the cam action that starts to separate the component module 12 from the base 14. The handle 60 may then be returned to the 90 degree usable position as shown in FIG. 5a. At that point, pulling on the handle 60 will separate the component module 12 from the base 14 because the cam action described above had substantially loosened the attachment between the component module 12 and the base 14.

As a result, the handle 160 may be used to both separate the meter 10 from the mounting device by pulling on the handle 160 without causing the cam action, and separate the component module 12 from the base 14 by first causing the cam action to take place before pulling on the handle 160.

Another preferred aspect of the extraction handle of the invention, illustrated in each of the embodiments described above, is that the combination of the extraction handle and the periphery of the component module 12 define a radial dimension that is no larger than the radial dimensions of the base 14. In other words, the extraction handle (overhangs 31 and 34 or the handle 60) does not extend beyond the periphery of the base 14.

In particular, the dimensions of the base 14 are typically dictated by the standard size of meter mounting devices in common use. In general, the base 14 is configured to fit snugly within the meter mounting device. If the component module 12 has features such as the extraction handle that extend beyond the periphery of the base 14, then it may be difficult or inconvenient to install the meter 10 in certain fixtures. By employing an extraction handle arrangement that does not extend beyond the periphery of the base 14, such difficulties may be avoided. However, it is noted that at least some of the advantages of the extraction handle arrangement of the present invention may be obtained even if it does extend beyond the periphery of the base.

With reference again to FIGS. 1–3, the cover 13 includes mounting flanges 24 and 26 on a periphery thereof that are received in corresponding slots 25 and 27 in a periphery 15 of the base 14. The slots 25 and 27 aid in aligning the component module 12 on the base 14 and preventing radial movement or rotation of the component module 12 while on the base 14. In addition, the mounting flanges 24 and 26 cooperate with the slots 25 and 27 to allow an optional sealing ring, not shown but which is well known in the metering art, to provide another secure attachment between the component module 12 and the base 14.

With reference to FIG. 2, the component module 112 includes a first mounting fastener assembly 28 and a second mounting fastener assembly 30, of which only a portion (mounting fastener opening 33) of the second mounting assembly 30 can be seen in the Figures. It should be appreciated that the first and second mounting fastener assemblies 28 and 30 respectively, are identical in form and function. Therefore, while the structure and function of only the first mounting fastener assembly 28 will be discussed below, the same principles, structures and functions should be considered as applicable to the second mounting fastener assembly 30. It will be noted that the component module of FIGS. 1 and 4 have substantially identical fastener assemblies 28 and 30.

The first mounting fastener assembly 28 incorporates the overhang 34, and includes a mounting fastener enclosure 32 that extends from the overhang 34 on a side of the component module 12. An opening or bore 36 is formed in the overhang 34 providing communication with the interior of the mounting fastener enclosure 32. The opening 36 is sized to receive (and remove) a mounting fastener 38 such as a rivet, an expansion rivet, screw, bolt, or other fastener that is operable to fasten the component module 112 to the base 14. As is known in the art, such fasteners include a portion that is to be retained by the base 14. For example, threads on a bolt or screw are configured to be retained by the base, as are portions of a rivet shaft or other fastener device.

FIGS. 6 through 13, discussed further below, show a preferred embodiment of a mounting fastener of the present invention. However, many of the advantages of the invention relating to the security sealing arrangement and the invention relating to the handle for separating the structures of the meter 10 discussed herein do not require the use of the inventive mounting fastener of FIGS. 6 through 13. However, the mounting fastener of FIGS. 6 through 13 has additional advantages as discussed further below.

Referring again to FIGS. 1 through 5, disposed at the opposite end of the mounting fastener enclosure 32 is an opening or bore 40 that is sized to allow only the shank 38a of the fastener 38 to extend therethrough but not the head 38b of the fastener 38. In this manner, the shank 38a of the fastener will be received in the base 14 while the head of the fastener 38b will abut and be held by the end of the fastener enclosure 32 adjacent the opening 40 to retain the component module 12 onto the base 14. While not shown, the base 14 will typically have a bore or other mounting fastener receipt area to accommodate the fastener 38. As discussed above the fastener shank 38a is configured to be retained by the base 14 to secure the component module 12 to the base 14. With continuing reference to FIG. 2, the component module 12 also includes a closure member 42 that is pivotally attached to the ledge 34 by a fastener 44 such as an expansion rivet or other suitable fastener. The closure member 42 is sized and configured to cover the opening 36 when the closure member 42 is pivotally moved into a closed position as depicted in FIGS. 3 and 4. In the exemplary embodiment described herein the closure member 42 is a plate, preferably made of a glass-filled polycarbonate.

The closure member 42 also includes a bore 46 that aligns with a bore 56 in the ledge 34 when the closure member 42 is pivoted into a closed position. An arm 54 of a conventional sealing device 52 may be placed through the aligned bores 46 and 56 when the closure member 42 is in the closed position to seal access to the opening 36 and thus the fastener 38.

As depicted in FIGS. 1 and 2, the closure member 42 is also pivotally movable into an open position which allows access to the fastener 38 via the opening 36. FIGS. 3 and 4 show the closure member 42 pivoted into a closed position wherein the opening 36 is covered thereby and thus access to the fastener 38 is prevented.

Referring to FIGS. 3 and 4, the exemplary sealing device 52 shown herein is a combination of a C-shaped wire or rod 52a and a bottom plate 52b. The C-shaped wire or rod 52a includes the arm 54 that is configured to pass through the bores 46 and 56. The bottom plate 52b is affixed to the ends of the rod 52a and preferably further comprises indicia 52c indicating that it is a sealing device. The indicia 52c acts as a visual deterrent from opening the meter 10 either inadvertently or for purposes of executing a fraud.

However, it will be appreciated that the sealing device 52 may take any number of other forms. To achieve many of the advantages of the present invention, the sealing device 52 need only be a structure that inhibits undetected movement of the closure member 42 from the closed position to the open position by passing through the bore 46 and 56. By "undetected", it means without leaving some visible indication that the closure member 42 has been moved from the closed to the opened position. Thus, the sealing device 52 preferably is a device that must be broken and reasonably difficult to repair or replace by the public. By way of example, a wire seal may be used as the sealing device as well as a wax seal. Many types of sealing devices are well known in the metering art.

Extending from the overhang 34 is a stop 48 that includes/ defines a receptacle 50 into which an end of the closure member 42 fits when the closure member 42 is in the closed position. Because the end of the closure member 42 is disposed within the receptacle 50, it is difficult for a tamperer to pry the end of the closure member 42 upward to gain access to the fastener 38. Moreover, because the closure member 42 is preferably molded from a durable plastic material such as polycarbonate, tampering will be evident by the naked eye. Particularly, the polycarbonate will fracture easily with excessive force or show stress marks with use of little force (i.e. prying). The plastic material however, is rigid enough to provide security before enough force is applied to cause fracturing.

As indicated above, the second mounting fastener assembly 30 is identical in form and function to the first mounting fastener assembly 28 with the exception, however, of a closure member that is absent from the second rivet mounting assembly 30. Thus, the second mounting fastener assembly 30 is adapted to receive a mounting fastener that assists in securing the component module 12 to the base 14. While it is typically only necessary to include one closure member 42 and corresponding sealing device 52 to inhibit tampering, it should be appreciated that the second mounting assembly 30 may also suitably include a closure member 42 and sealing device 52 if desired.

Another inventive aspect discussed herein relates to a mounting fastener that releasably secures a removable structure of a meter, such as, for example, the component module 12 from a metering element, for example, the base 14, that is affixed to a facility and is connected to the commodity being metered. Such a mounting fastener facilitates separation of the removable structure from the base without requiring special tools. Preferably, as discussed above in connection with FIGS. 1 through 5, the mounting fastener is used in connection with a security sealing arrangement that inhibits removal of the removable structure from the base by unauthorized persons.

Figure 6:
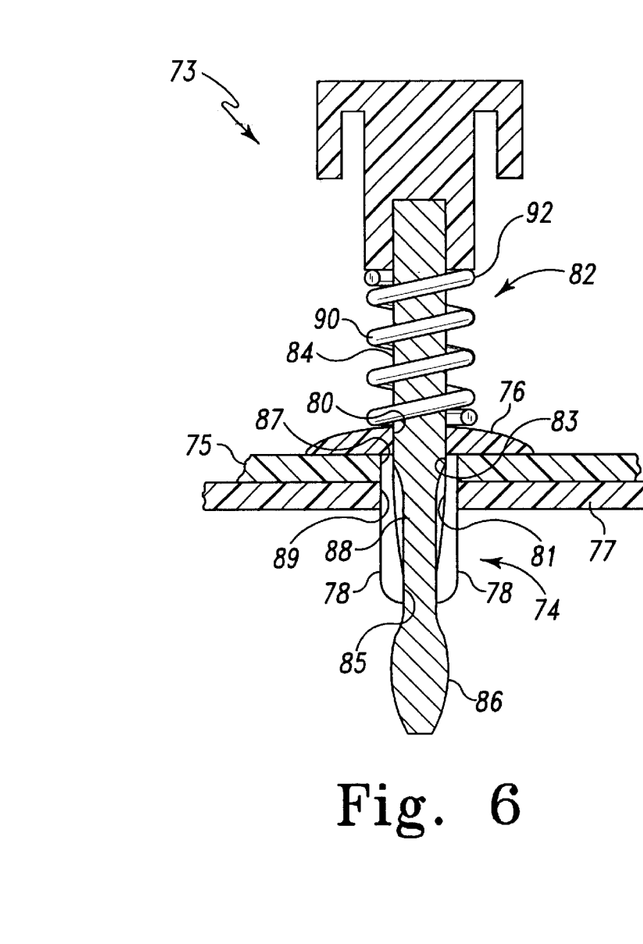
FIG. 6 is a cutaway view of an exemplary mounting fastener according to one aspect of the present invention used in connection with a removable structure and a base of a metering configuration shown in fragmentary form.
Figures 7, 8:
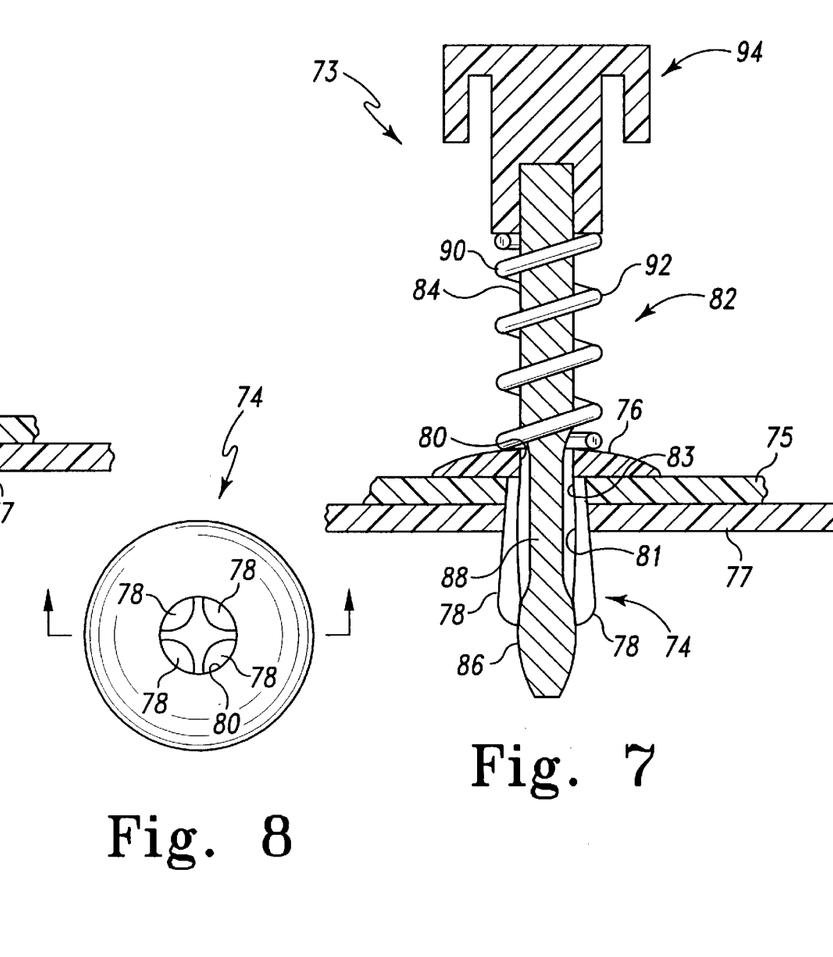
FIG. 7 is the cutaway view of the mounting fastener of FIG. 6 shown in a different position.
FIG. 8 is a top plan view of the mounting fastener of FIG. 6 apart from the removable structure and base.

To this end, FIGS. 6 and 7 show an exemplary mounting fastener 73 according to the present invention which is employed to releasably secure a removable structure 75 (shown in fragmentary portion) to a base 77 (shown in fragmentary portion). The removable structure 75 may suitably be a component module such as the component module 12 described above in connection with FIGS. 1 through 5, another type of removable module, or a removable cover of a modular or non-modular meter. The base 77 may suitably be a base portion of a modular meter, a meter mounting device, or the main metering element of a non-modular meter.

In general, the mounting fastener 73 includes a first member 74 and a second member 82. The first member includes a head portion 76 and a plurality of legs 78 extending axially away from the head portion 76. The plurality of legs 78 includes at least two legs and preferably four legs. The head portion 76 includes an aperture 80 defined therethrough, which is in conmmunication with a space defined between the plurality of legs 78. (See FIG. 8). The aperture 80 and the space between the plurality of legs 78 form a shaft receptacle 81.

The head portion 76 is adapted to engage a top surface of the removable structure 75. The plurality of legs 78 are adapted to be inserted through first and second openings 87, 89 defined in the base 77 and the removable structure 75. It will be appreciated, however, that the mounting fastener 73 may be inverted such that the head portion engages a bottom surface of the base 77.

The second member 82 includes a shaft 84. The shaft 84 is further defined by a first shaft portion 86 having a first width and a second shaft portion 88 having a second width.

The first width exceeds the second width. The shaft 84 is at least partially insertable into the shaft receptacle 81 into a first position (FIG. 7) and a second position (FIG. 6).

The first width of the first shaft portion 86 is further selected to cause deformation of at least some of the plurality of legs 78 when the shaft 84 is inserted into the first position (FIG. 7). In particular, the first shaft portion 86 tends to push the plurality of legs 78 radially outward as shown in FIG. 7. When pushed outward, the outer portions of the plurality of legs 78 become wider than at least one of the openings 87, 89 such that movement of the plurality of legs 78 through the openings 87, 89 is substantially inhibited.

To this end, in the exemplary embodiment described herein, the shaft receptacle 81 includes first end 83 and a second end 85. The first end 83 of the receptacle 81 is proximate to the head portion 76 and the second end 85 is opposite the first end 83. Accordingly, the plurality of legs 78 extend from the first end 83 to the second end 85. In the first position, the shaft 84 is positioned such that the wider first shaft portion 86 is disposed within the second end 85 of the receptacle 81 as shown in FIG. 7. Such positioning of the first shaft portion 86 provides the maximum spread of the plurality of legs 78 to inhibit movement of the plurality of the legs 78 through the openings 87, 89. However, it will be appreciated that the present invention may still function properly, albeit less efficiently, even if the first shaft portion 86 is not located within the second end 85 of the receptacle 81. For example, the first shaft portion 86 in the first position may also be located between the second end 85 and the openings 87, 89 and still deform the first plurality of legs 86 sufficiently to inhibit movement through the openings 87, 89.

The second width of the second shaft portion 88 is selected to cause less or no deformation of the plurality of legs 78 when the shaft 84 is inserted into the second position. (FIG. 6). As a result, when the shaft 84 is in the second position as shown in FIG. 6, the movement of the plurality of legs 78 through the openings 87, 89 is substantially less inhibited. To this end, in the exemplary embodiment described herein, the thinner second shaft portion 88 is preferably positioned at or near the second end 83. More importantly, in the second position, the wider first shaft portion 86 is not located within the second end 85 of the receptacle 81. In the exemplary embodiment described herein, the first shaft portion 86 is located external to the receptacle 81 such that the second end 85 is disposed between the first end 83 and the first shaft portion 86 as shown in FIG. 6.

The second member 82 further includes an actuating end 94 that allows manipulation of the second member 82 between the first and second positions. In order to prevent the second member 82 from falling or being forced through the receptacle 81, and thus difficult to manipulate, the second member 82 preferably includes feature on or near the actuating end 94 that has a diameter larger than the aperture 80. For example, the actuating end 94 may include a flange portion 92 that has a width greater than the width of the aperture 80.

In a preferred embodiment, the mounting fastener 73 further includes a spring 90 having one end in fixed engagement with the shaft 84 and another end in fixed engagement with the head portion 76 to effectuate a biasing force therebetween. In particular, the spring 90 provides a biasing force that tends to pull the first shaft portion 86 from the second position (FIG. 6) to the first position (FIG. 7). The spring 90 adds convenience and potentially to the reliability of the mounting fastener 73 by tending to bias the mounting fastener 73 into the first position, which is the locked position.

The spring 90 is disposed about the shaft 84 between the head portion 76 of the first member 74 and the flange portion 92 of the second member 82. The spring 90 may be affixed to the shaft 84 by seating against the flange portion 92 of the second member 82. Alternatively, the spring 90 may be affixed to the shaft 84 using other conventional means, such as by threading a lead end of the spring 90 through a through-hole in the shaft 84, not shown.

Figure 9:
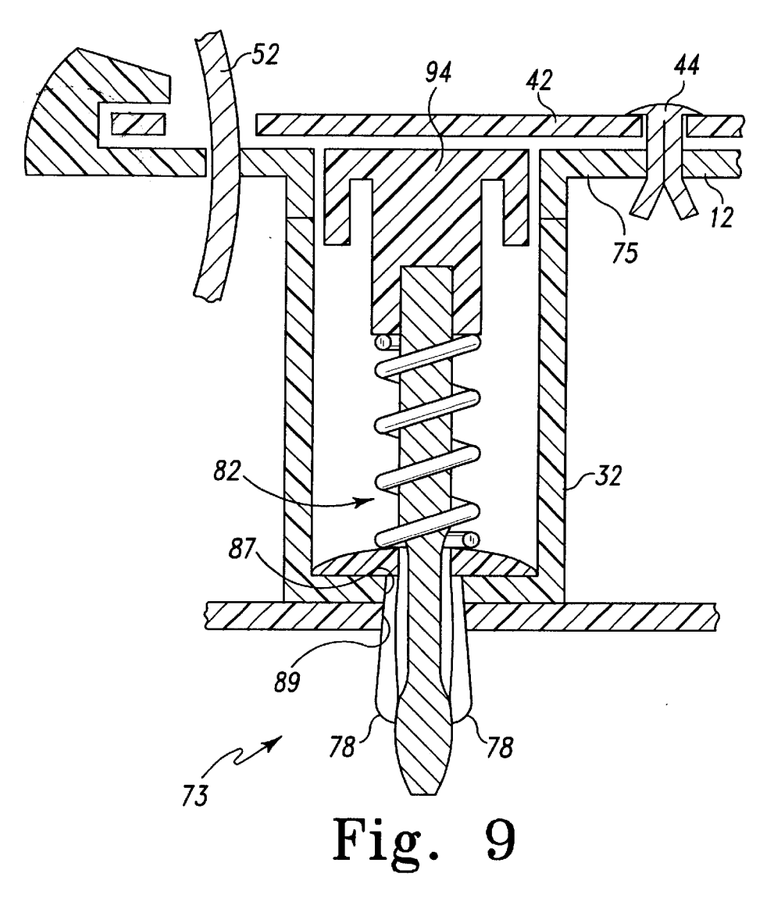
FIG. 9 is a cutaway view of the mounting fastener of FIG. 6 shown in place on the meter of FIGS. 2 and 3 shown in fragmentary form.

FIG. 9 shows the mounting fastener 73 in the first position used in connection with a fastener enclosure arrangement affixed to a removable meter structure and adapted to receive at least a portion of the mounting fastener 73, wherein the fastener enclosure arrangement is configured to inhibit access to the mounting fastener 73.

By way of example, the fastener enclosure arrangement may include the fastener enclosure 32 the closure member 42 discussed above in connection with FIGS. 1 through 4 and the removable meter structure may be the component module 12. However, it will be appreciated that fastener enclosures and closure members of other shapes and sizes may be employed in other configurations of the fastener enclosure arrangement for the purposes of inhibiting access to the mounting fastener 73 in a utility meter.

Referring to FIG. 9, the mounting fastener 73 is disposed in the first position with its actuating end 94 within the fastener enclosure 32. The closure member 42 is in the closed position, thereby preventing manipulation of the actuating end 94 without damaging the closure member 42.

In operation, the mounting fastener 73 as shown in FIG. 9 inhibits removal of the removable module 12 from the base 14 because the plurality of legs 78 do not fit through the apertures 87, 89. To separate the removable module 12 from the base 14, an authorized operator removes the sealing device 52 so that the closure member 42 can rotate about the pivot fastener 44 to the open position. (See, e.g., FIGS. 1 and 2). Once the closure member 42 is in the open position, the operator depresses the actuating end 94 thereby causing the first shaft portion 86 to move from within the second end 85 of the receptacle 81 out from the second end 85 until it is external to the receptacle 81 (as shown in FIG. 6).

Without releasing the actuating end 94 and thereby retaining the second member 82 in the second position, the operator exerts a force in the opposite direction on the component module 12 to move the component module 12 away from the base 14. To this end, it is preferable to have a graspable surface such as those described above in connection with FIGS. 1 through 5. Using a graspable surface, the operator may push down on the actuating end 94 with his or her thumb while pulling against the graspable surface with his or her other fingers.

One advantage of the mounting fastener 73 is the convenience as compared to a rivet or bolt fastener that requires additional tools and/or takes more time to remove and replace. It will be appreciated that in some embodiments, tools may still be required to remove the mounting fastener 73, but in such cases the mounting fastener 73 still allows for quick and convenient removal when compared to other conventional fasteners.

Figure 10:
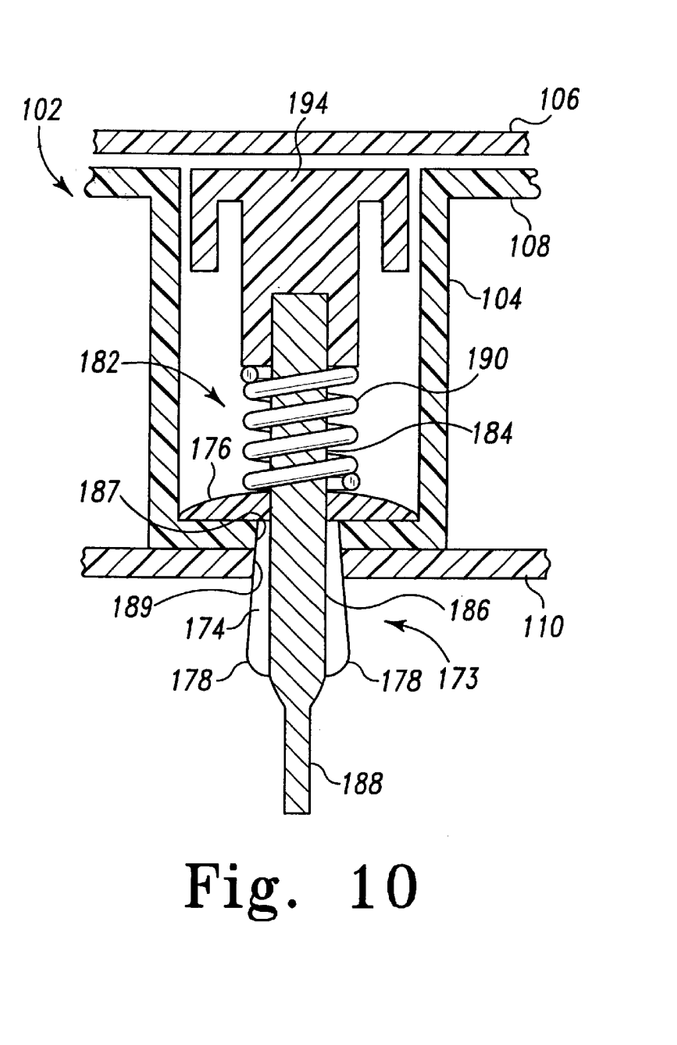
FIG. 10 is a cutaway view of an alternative embodiment of the mounting fastener according to the present invention used in connection with an exemplary fastener enclosure arrangement shown in fragmentary form.
Figure 11:
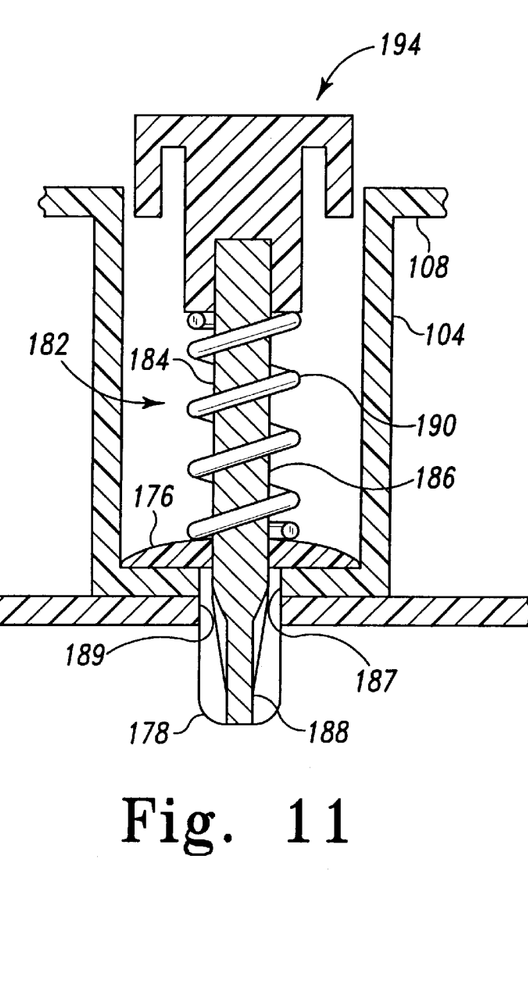
FIG. 11 is a cutaway view of the mounting fastener and fastener enclosure arrangement of FIG. 10 in a different operating position.

FIGS. 10 and 11 show an alternative embodiment of the mounting fastener employed in relatively generic fastener enclosure arrangement 102 according to the present invention. The fastener enclosure arrangement 102 includes a fastener enclosure 104 and a closure member 106. The fastener enclosure arrangement 102 is secured to a removable structure 108 of a utility meter, shown as a fragmentary portion in FIGS. 10 and 11, which may be a removable module or a removable cover of a utility meter. The removable structure 108 is removable from a base structure 110 of the utility meter.

In the alternative embodiment shown in FIGS. 10 and 11, the mounting fastener 173 includes a first member 174 similar to the first member 74 of FIGS. 6 through 8, and includes a similar head portion 176 and a similar plurality of legs 178. The mounting fastener 173 further includes a second member 182 that comprises a shaft 184 and an actuating end 194. The mounting fastener 173 also includes a spring 190 disposed in a biasing relationship with respect to the shaft 184.

The shaft 184 includes a first shaft portion 186 and a second shaft portion 188. Similar to the embodiment described above in connection with FIGS. 6 through 8, the first shaft portion 186 has a first width that exceeds a second width of the second shaft portion 188. However, the relative locations of the first shaft portion 186 and the second shaft portion 188 are juxtaposed as compared to the relative locations of the first shaft portion 86 and the second shaft portion 88 of FIGS. 6 through 8. In particular, the first shaft portion 186 is disposed between the second shaft portion 188 and the actuating end 194.

As a result, the shaft 184 is in the first position when the actuating end 194 is depressed, as shown in FIG. 10. Because the actuating end 194 is depressed, the spring 190 is compressed and tends to bias the actuating end 194 outward, thereby tending to urge the shaft 184 toward the second position (FIG. 11). However, the closure member 106 impedes the movement of the shaft 184 into the second position when the closure member 106 is in the closed position as shown in FIG. 10.

In operation, an authorized operator places the removable structure 108 on the base 110 while the closure member 106 is in the open position and the shaft 184 in the second position as shown in FIG. 11. The operator then depresses the actuating end 194 and places the closure member 106 in the closed position to trap the shaft 184 in the first position. (FIG. 10). In the first position, as discussed above, the first shaft portion 186 deforms the plurality of legs 178 such that the movement of the plurality of legs 178 through the openings 187, 189 is substantially inhibited.

To separate the removable structure 108 from the base 110, the operator places the closure member 106 in the open position. The spring 190 then urges the shaft 184 from the first position to the second position as shown in FIG. 11. Once in the second position, there is little or no inhibition of the movement of the plurality of legs 178 through the openings 187, 189. The operator may therefore readily separate the removable structure 108 from the base 110.

It will be appreciated that the alternative embodiment in FIGS. 10 and 11 may further be modified, as with the embodiments of FIGS. 6 through 8, in several ways and still benefit from at least some of the features of the present invention. For example, the mounting fasteners 73, 173 will still provide some of the benefits of the present invention if no spring is used, or if the biasing force is provided by another means. Likewise, it will be appreciated that the actuating end 194 may take any of a plurality of suitable forms, including those that may require a tool to manipulate.

One alternative to the actuating end 194 may include a retention mechanism that eliminates the need for the closure member 106 to retains the mounting fastener 173 in the first position. For example, the retention mechanism may be one that cooperates with the fastener enclosure 104 to alternatively retain the mounting fastener 173 in the first and second positions responsive to depressing the actuating end. Such a retention mechanism may include structures such as those employed on ordinary spring loaded retractable pens. Such a mechanism may be found on the Model No. 65382 Gel Ink Pen available from Sanford Corporation of Bellwood, Ill. Such a device includes a rotating shaft portion that has features that interlock with features on an outer surface such as that of the fastener enclosure 104. When the device is depressed once, the shaft rotates to a position in which the features interlock to retain the shaft in the first position. When the device is depressed again, the shaft rotates to a new position in which the features interlock to retain the shaft in the second position. Because this embodiment does not require the closure member 106 to retain the second member 182 in the first position, the closure member 106 may be omitted if not needed for security purposes. It is also noted that the above described mechanism may also be employed in the embodiment of FIGS. 6 through 9.

Figure 12:
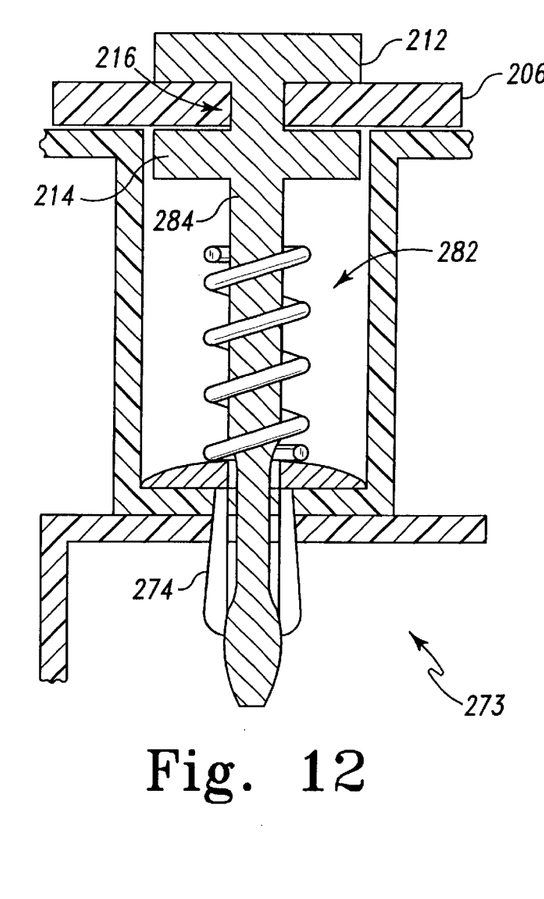
FIG. 12 is a cutaway view of another alternative embodiment of the mounting fastener according to the present invention used in connection with an alternative fastener enclosure arrangement shown in fragmentary form.
Figure 13:
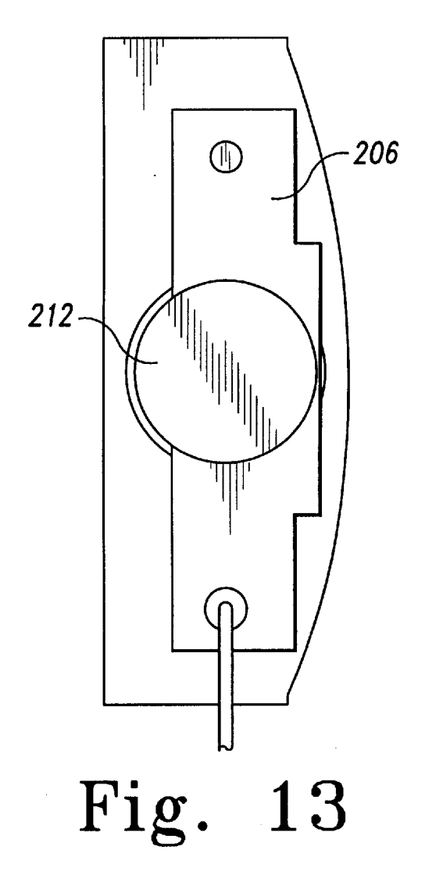
FIG. 13 is a top plan view of the mounting fastener and fastener enclosure arrangement of FIG. 12.
Figure 14:
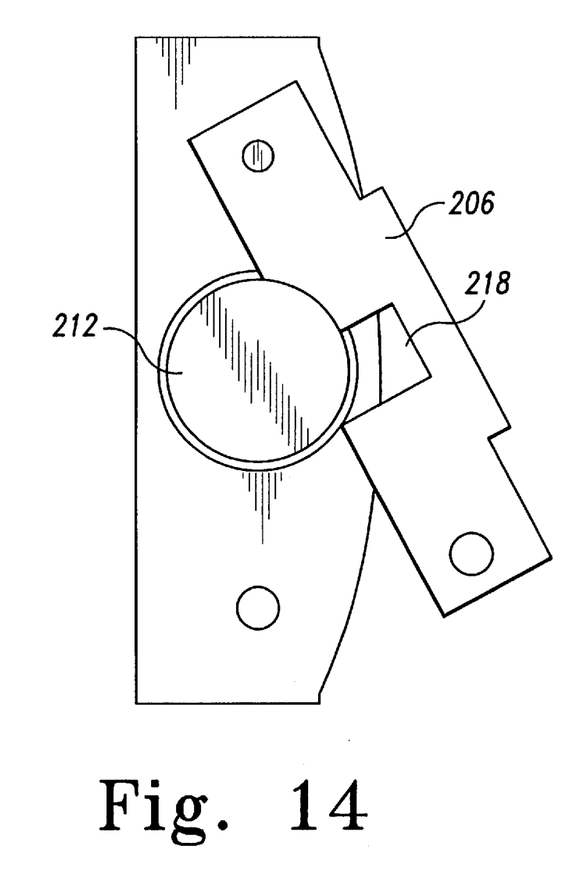
FIG. 14 is a top plan view of the mounting fastener and fastener enclosure arrangement of FIG. 12 in a different operating position.

FIGS. 12 through 14 show yet another alternative embodiment of a mounting fastener 273 intended for use in connection with a fastener enclosure arrangement that has a closure member 206 that interlocks with flanges 212 and 214 on the second member 282 of the mounting fastener 273. The mounting fastener 273, with one significant exception, may suitably be substantially identical to the mounting fastener 73 of FIGS. 6 through 8.

The main difference with the mounting fastener 273 is that the second member 282 includes a first flange 212 and a second flange 214 disposed on the shaft 284. The first flange 212 and the second flange 214 form a slot 216 therebetween. The slot 216 is adapted to receive a portion of a movable locking mechanism 206. The movable locking mechanism 206 may suitably be a modified version of the closure member 106 of FIGS. 10 and 11. In any event the movable locking mechanism 206 is adapted to inhibit movement of the second member 282 with respect to the first member 274 when a portion of the movable locking mechanism 206 is disposed within the slot 216.

To this end, as shown in FIGS. 13 and 14, the movable locking mechanism 206 is in the form of the closure member 106 of FIGS. 10 and 11 with a cut-out section 218 that is configured to receive the portion of the shaft 284 that is disposed within the slot 216. However, the cut-out section 218 is further configured to interlock the shaft 284 between the flanges 212 and 214. (See FIGS. 12 and 13). As a result, the movable locking mechanism 206 inhibits movement of the shaft 284 between the first and second positions.

It will be appreciated that the slot and movable locking mechanism may alternatively be incorporated into an arrangement that includes a mounting fastener having first and second shaft portions configured as shown in FIGS. 10 and 11.

Moreover, while this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

For example, with regard to the mounting fasteners 73, 173 and 273 of FIGS. 6 through 14, it is noted that the first member (e.g. first member 74) need not have a plurality of legs extending from the head portion. Those of ordinary skill in the art may readily devise an implementation in which the first member (e.g. first member 74) only includes a single leg. In such an embodiment, the base (e.g. base 14, 77) may include a rigid structure that is disposed opposite the single leg when the single leg is inserted through the openings 87, 89. As such, the rigid structure would urge the first shaft portion (e.g. first shaft portion 86) against the single leg when the second member (e.g. second member 82) is in the first position, thereby causing the single leg to deform outward such that the single leg and first shaft portion would not fit through the openings 87, 89. Accordingly, while it is preferable to employ a first member having a plurality of legs, the present invention includes embodiments in which the first member has a set of one or more legs.

It will also be appreciated that the above disclosure shows several inventions which in combination provide substantial advantages over the prior art meters. However, it will be noted that significant advantages may be obtained by incorporation of any of the inventions apart from the others. For example, the extraction handle inventions have advantages that do not require the security arrangement or mounting fastener inventions described herein. Likewise, the security arrangement inventions have advantages that do not require the mounting fastener or extraction handle inventions described herein. Such arrangements would employ more conventional mounting fasteners. Finally, the mounting fastener inventions have advantages that do not require the extraction handle or security arrangements described herein.

What is claimed is:

1. In a utility meter having a base configured to be mounted to a structure and a component module adapted to be releasably secured to the base, an arrangement for inhibiting unauthorized removal of the component module from the base, the arrangement:
   a mounting fastener assembly disposed on the component module, the mounting fastener assembly having an access opening configured to receive a mounting fastener, and a mounting opening configured to allow a portion of the mounting fastener to extend therethrough and into the base, the mounting fastener including a portion configured to be retained by the base; and
   a closure element pivotally attached to the component module, the closure element movable into a first position wherein the closure element restricts the access opening and into a second position wherein the access opening is accessible.

2. The arrangement of claim 1, wherein the closure element comprises a plate.

3. The arrangement of claim 2, further comprising:
   a first bore in the component module;
   a second bore in the plate, the second bore configured to align with the first bore when the plate is in the first position; and
   a sealing device configured to be received by the first bore and the second bore when the plate is in the first position.

4. The arrangement of claim 1, wherein the closure element is constructed of a polycarbonate material.

5. The arrangement of claim 1, further comprising a receptacle disposed on the component module, the receptacle adapted to receive an edge of the closure element.

6. The arrangement of claim 5, wherein the mounting fastener assembly further comprises an overhang, and wherein the closure element and the receptacle are disposed on the overhang.

7. The arrangement of claim 6, wherein the overhang radially extends from a periphery of the component module.

8. A component module for a modular utility meter, the component module configured to be releasably coupled with a base that is adapted to be affixed to a structure and in communication with a utility commodity, the component module comprising:
   a housing;
   a fastener mount on the housing, the fastener mount including a first opening configured to receive a mounting fastener, and a second opening configured to allow a portion of the mounting fastener to extend therethrough to be received by the base, the mounting fastener including a portion configured to be retained by the base; and
   a closure element operable in a first position to restrict access to the first opening, and a second position to allow access to the first opening.

9. The component module of claim 8, wherein the closure element comprises a pivoting plate.

10. The component module of claim 9, further comprising:
    a first bore in the component module;
    a second bore in the plate, the second bore configured to align with the first bore when the pivoting plate is in the first position; and
    a sealing device configured to be received by the first bore and the second bore when the plate is in the first position.

11. The component module of claim 9, wherein the pivoting plate is constructed of a polycarbonate material.

12. The component module of claim 9, further comprising:
    a receptacle disposed on the housing and adapted to receive an edge of the pivoting plate.

13. The component module of claim 12, wherein the fastener mount further comprises an overhang on the component module, and wherein the plate and the receptacle are disposed on the overhang.

14. The component module of claim 13, wherein the overhang radially extends from a periphery of the housing.

15. In a utility meter having a housing configured to be releasably secured to a structure, an arrangement for inhibiting unauthorized removal of the housing from the base, the arrangement comprising:
    a mounting fastener assembly disposed on the housing, the mounting fastener assembly having an access opening configured to receive a mounting fastener, the mounting fastener configured to fasten the housing to the structure;
    a closure element pivotally attached to the component module, the closure element movable into a first position wherein the closure element restricts the access opening and into a second position wherein the access opening is accessible.

16. The arrangement of claim 15 wherein the housing comprises a component module of the utility meter, and wherein the mounting fastener is configured to fasten the component module to a base of the utility meter.

17. The arrangement of claim 16, wherein the mounting fastener assembly further comprises an overhang, and wherein the closure element and the receptacle are disposed on the overhang.

18. The arrangement of claim 16, wherein the overhang radially extends from a periphery of the component module.

19. The arrangement of claim 15, wherein the mounting fastening assembly further includes a mounting opening configured to allow a portion of the mounting fastener to extend therethrough and into the structure and retain a portion of the mounting fastener.

20. The arrangement of claim 15, wherein the closure element comprises a plate.

21. The arrangement of claim 15, further comprising:

a first bore in the housing;

a second bore in the closure element, the second bore configured to align with the first bore when the closure element is in the first position; and a sealing device configured to be received by the first bore and the second bore when the closure element is in the first position.

22. The arrangement of claim 21 wherein the sealing element comprises a wire that passes through the first and second bore.

23. The arrangement of claim 22 wherein the sealing element further comprises a plate coupled to the wire, the plate having indicia disposed thereon.

24. The arrangement of claim 15, further comprising a receptacle disposed on the component module, the receptacle adapted to receive an edge of the closure element.

* * * * *